(12) United States Patent
Inoue

(10) Patent No.: US 11,689,830 B2
(45) Date of Patent: Jun. 27, 2023

(54) IMAGE PICKUP APPARATUS AND IMAGE PICKUP SYSTEM

(71) Applicant: CANON KABUSHIKI KAISHA, Tokyo (JP)

(72) Inventor: Chiaki Inoue, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/368,672

(22) Filed: Jul. 6, 2021

(65) Prior Publication Data
US 2022/0014703 A1  Jan. 13, 2022

(30) Foreign Application Priority Data
Jul. 13, 2020 (JP) .................. 2020-119816

(51) Int. Cl.
| | | |
|---|---|---|
| *H04N 5/374* | (2011.01) | |
| *H04N 5/372* | (2011.01) | |
| *H04N 5/77* | (2006.01) | |
| *H04N 5/33* | (2006.01) | |
| *H04N 9/04* | (2006.01) | |
| *H04N 9/07* | (2006.01) | |
| *H04N 9/09* | (2006.01) | |
| *H04N 9/79* | (2006.01) | |

(Continued)

(52) U.S. Cl.
CPC ....... *H04N 25/77* (2023.01); *H01L 27/14621* (2013.01); *H01L 27/14627* (2013.01); *H04N 25/71* (2023.01)

(58) Field of Classification Search
CPC ...... H04N 5/3745; H04N 5/332; H04N 5/372; H04N 5/772; H04N 9/0451; H04N 9/0455; H04N 9/07; H04N 9/79; H04N 9/09; H04N 2201/3256; H04N 5/77; H04N 25/71; H04N 23/11; H04N 23/75; H04N 23/663; H01L 27/14621; H01L 27/14627; G06V 10/143; G06V 40/197

See application file for complete search history.

(56) References Cited

U.S. PATENT DOCUMENTS 8,199,229 B2 * 6/2012 Masuno ............... H04N 25/131
                                                              348/276
9,743,825 B2 * 8/2017 Hirota ..................... G06T 7/30
(Continued)

FOREIGN PATENT DOCUMENTS

| JP | 2009-33222 A | 2/2009 |
| JP | 2009-258618 A | 11/2009 |
| JP | 2017-208778 A | 11/2017 |

*Primary Examiner* — Marly S Camargo
(74) *Attorney, Agent, or Firm* — Canon U.S.A., Inc. IP Division

(57) ABSTRACT

An apparatus configured to acquire a plurality of spectral images of an object includes at least one processor configured to execute a plurality of tasks including a selection task configured to select a recording wavelength band according to an input by a user, and a control task configured to store in a memory information on a spectral image corresponding to the recording wavelength band. The apparatus acquires the plurality of spectral images by imaging the object through a plurality of lens units each configured to form an image of the object, and a plurality of filters each of which is disposed on a corresponding one of optical axes of the plurality of lens units.

14 Claims, 3 Drawing Sheets

(51) Int. Cl.

| | |
|---|---|
| *H01L 27/146* | (2006.01) |
| *G06V 10/14* | (2022.01) |
| *G06V 40/19* | (2022.01) |
| *H04N 25/77* | (2023.01) |
| *H04N 25/71* | (2023.01) |

(56) References Cited

U.S. PATENT DOCUMENTS

| | | | |
|---|---|---|---|
| 10,419,685 B2* | 9/2019 | Ichikawa | H04N 23/843 |
| 10,521,893 B2* | 12/2019 | Shiga | H06T 5/50 |
| 10,539,463 B2* | 1/2020 | Hwang | G01J 3/2823 |
| 2006/0203100 A1* | 9/2006 | Aijito | H04N 9/045 |
| | | | 348/220.1 |
| 2012/0249821 A1* | 10/2012 | Imai | H04N 5/772 |
| | | | 348/222.1 |
| 2015/0051498 A1* | 2/2015 | Darty | G01J 3/10 |
| | | | 600/477 |
| 2015/0112135 A1* | 4/2015 | Hirota | A61B 1/00009 |
| | | | 600/109 |
| 2016/0259099 A1* | 9/2016 | Cui | G01J 3/505 |
| 2017/0163901 A1* | 6/2017 | Lin | G06V 10/143 |
| 2018/0040966 A1* | 1/2018 | Ishikawa | H04N 9/0451 |
| 2018/0100764 A1* | 4/2018 | Hwang | A61B 5/0013 |
| 2019/0005631 A1* | 1/2019 | Shiga | G06T 5/50 |
| 2019/0180865 A1* | 6/2019 | Kashima | G16H 30/40 |
| 2020/0302149 A1* | 9/2020 | Gottemukkula | G06V 40/197 |
| 2021/0374448 A1* | 12/2021 | Jacquot | G06V 10/771 |

* cited by examiner

IMAGE PICKUP APPARATUS AND IMAGE PICKUP SYSTEM

BACKGROUND OF THE DISCLOSURE

Field of the Disclosure

The aspect of the embodiments relates to an image pickup apparatus and an image pickup system.

Description of the Related Art

There has recently been proposed a method for analyzing a composition of an object or identifying the object that is hard to visually recognize, using a camera configured to acquire visible and invisible band information in addition to RGB or three-band (wavelength band) information that matches a visual characteristic of a human.

Japanese Patent Laid-Open No. ("JP") 2017-208778 discloses an image pickup apparatus including a plurality of spectral filters having different transmission characteristics detachably attached between a sensor and a lens array including many small-diameter lenses.

The image pickup apparatus disclosed in JP 2017-208778 acquires a plurality of duplicate images including wavelength components different from each other using a plurality of small-diameter lenses through the plurality of spectral filters. However, if all the duplicate images are recorded, the capacity of the recorded data will increase.

SUMMARY OF THE DISCLOSURE

An apparatus according to one aspect of the embodiments is configured to acquire a plurality of spectral images of an object and includes at least one processor configured to execute a plurality of tasks including a selection task configured to select a recording wavelength band according to an input by a user, and a control task configured to store in a memory information on a spectral image corresponding to the recording wavelength band. The apparatus acquires the plurality of spectral images by imaging the object through a plurality of lens units each configured to form an image of the object, and a plurality of filters each of which is disposed on a corresponding one of optical axes of the plurality of lens units.

A system including the above apparatus also constitutes another aspect of the embodiments.

Further features of the disclosure will become apparent from the following description of exemplary embodiments with reference to the attached drawings.

DESCRIPTION OF THE EMBODIMENTS

Figure 1:
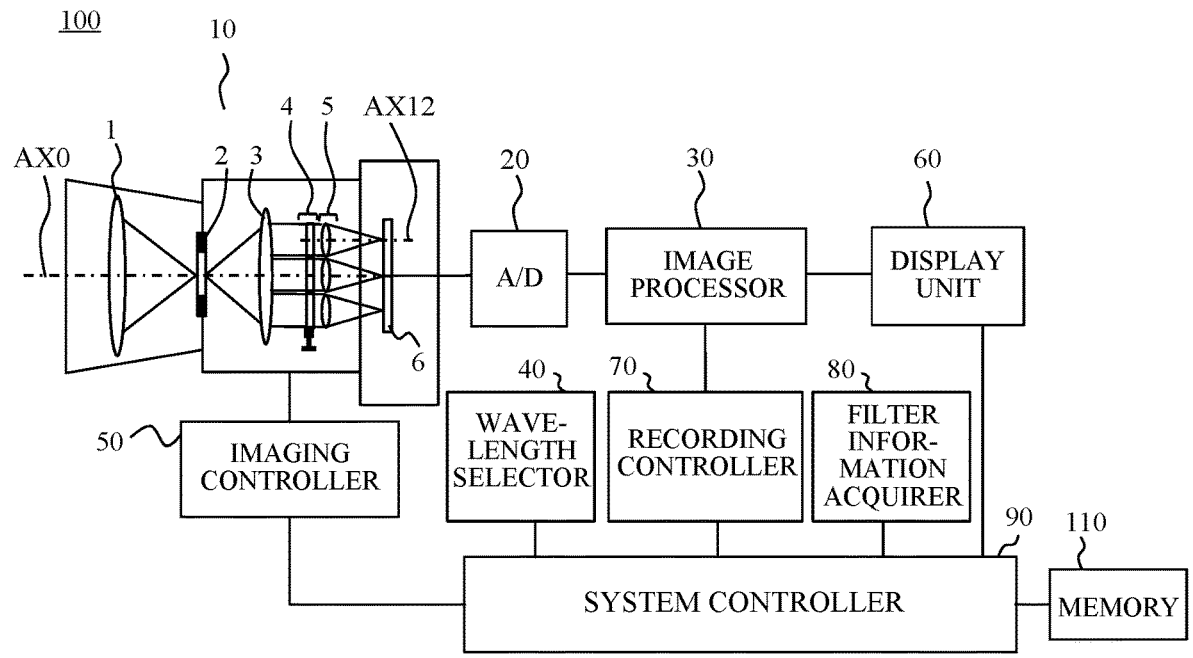
FIG. 1 is a block diagram of an image pickup system according to a first embodiment.

Referring now to the accompanying drawings, a detailed description will be given of embodiments according to the disclosure. Corresponding elements in respective figures will be designated by the same reference numerals, and a duplicate description thereof will be omitted.

First Embodiment

Figure 2:
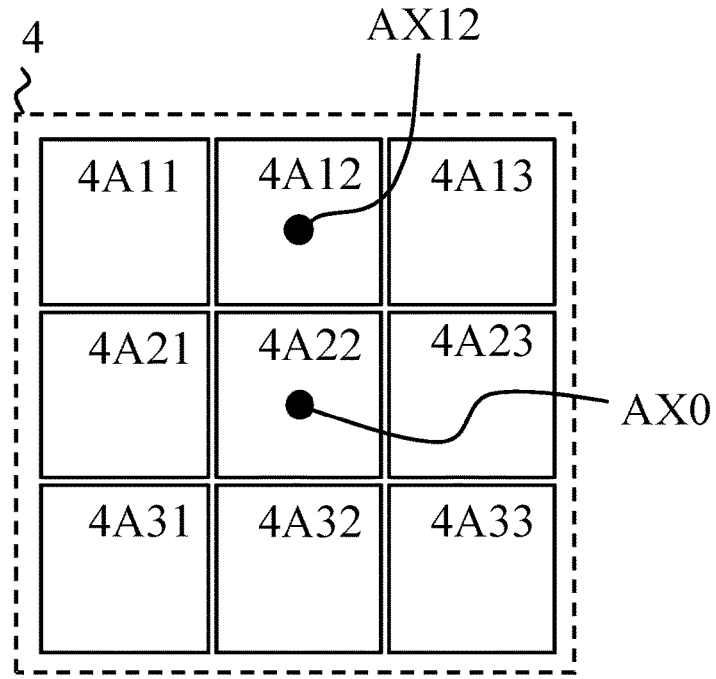
FIG. 2 is a schematic view of a filter array viewed from an object side.

FIG. 1 is a block diagram of an image pickup system 100 according to this embodiment. FIG. 2 is a schematic view of a filter array 4 viewed from the object side.

The image pickup system 100 includes an imaging unit 10, an A/D converter 20, an image processor 30, a wavelength selector (selection unit) 40, an imaging controller 50, a display unit 60, a recording controller 70, a filter information acquirer 80, a system controller (control unit) 90, and a memory 110. The A/D converter 20, the image processor 30, the wavelength selector 40, the imaging controller 50, the display unit 60, the recording controller 70, the filter information acquirer 80, the system controller 90, and the memory 110 are installed in a camera body (image pickup apparatus).

The imaging unit 10 includes, in order from the object side (left side in the figure), an objective lens 1, a field diaphragm 2, a collimator lens 3, a filter array (a plurality of filters) 4, a lens array (a plurality of lens units) 5, and an image sensor 6. The objective lens 1 to the lens array 5 may be installed in an interchangeable lens unit that is attachable to and detachable from the camera body including the image sensor 6. The field diaphragm 2 to the lens array 5 may be installed in an interchangeable lens unit different from the interchangeable lens unit including the objective lens 1.

The filter array 4 includes a plurality of filters each of which is disposed on a corresponding one of optical axes of the plurality of small-diameter lenses of the lens array 5. The plurality of filters include first and second filters having transmission characteristics different from each other. In this embodiment, as illustrated in FIG. 2, the filter array 4 includes filters 4A11 to 4A33, but may be divided into 5×5 or 4×3. The lens array 5 includes a plurality of small-diameter lenses. The objective lens 1, the collimator lens 3, and the small-diameter lens at the center of the lens array 5 share an optical axis AX0, but the small-diameter lenses in the periphery of the lens array 5 shift from the optical axis AX0. An optical axis AX12 is one of the optical axes of the small-diameter lenses in the periphery of the lens array 5. Due to this configuration, an intermediate image of the object on the field diaphragm 2 formed by the objective lens 1 is duplicated on the image sensor 6 by the small-diameter lens in the lens array 5, and duplicated images (spectral images) can be formed in an array shape. The filter disposed on the optical path of each of the plurality of small-diameter lenses can provide a spectral image with a different wavelength component.

The filter array 4 is configured attachable to and detachable from the imaging unit 10. This configuration can easily provide various multi-band images. The filter array 4 alone may part of an optical apparatus that is attachable to and detachable from the imaging unit 10, or part of an optical apparatus that is attachable to and detachable from the lens array 5 and the imaging unit 10.

The image sensor 6 photoelectrically converts an optical image that has reached an imaging plane into an electric signal (analog signal). This embodiment uses a silicon CCD or CMOS for the image sensor 6. The image sensor 6 may include a single image sensor having a plurality of imaging areas, or an image sensor array that includes a plurality of image sensors each configured to photoelectrically convert a spectral image formed by the corresponding one of small-diameter lenses in the lens array 5.

The A/D converter 20 converts the analog signal output from the image sensor 6 into a digital signal and supplies it to the image processor 30.

The image processor 30 performs calculation processing, such as luminance correction processing, distortion correction processing, and combination and addition processing, for the digital signal from the A/D converter 20, and transmits the processed signal to the system controller 90. The image processor 30 may include a spectroscopic (or spectral) information analyzer or a pseudo color image generator. The spectroscopic information analyzer performs spectral analysis processing of the object using a plurality of spectral images, recognizes the object based on the spectral analysis result, and checks the truthfulness. The pseudo color image generator generates a pseudo RGB color image from a plurality of spectral images.

The filter information acquirer (acquisition unit) 80 acquires information on the filter array 4 (information on a plurality of filters, filter array information). The filter array information is information such as information on a signal for determining a replacement of the filter array 4, position information of each filter, information on a transmission characteristic of each filter, and ID information which is product ID information of the filter array. The filter array information may be stored in the memory 110 or in the imaging unit 10 (not including the camera body). When the filter array 4 is configured as a unit component (filter array unit), the filter array information may be stored in a memory provided in the filter array unit.

The wavelength selector (selection unit) 40 selects a wavelength band to be recorded by the user according to an input by a user, and outputs the selection result (recording wavelength band) to the system controller 90. The user input may be executed with an input button described later, a touch panel, or an eye tracker.

The system controller 90 causes, based on the selection result acquired from the wavelength selector 40, the recording controller 70 to store in the memory, information on the spectral image in the recording wavelength band.

The recording controller 70 stores a plurality of still images and motion images, and a file header when forming an image file. The memory 110 stores a plurality of still images and motion images, the file header when forming the image file, various programs executed by the system controller 90, and data required for the program. The display unit 60 includes a liquid crystal display element or the like, and displays an image, a state or abnormality of the image pickup system 100, or the like.

Figure 3:
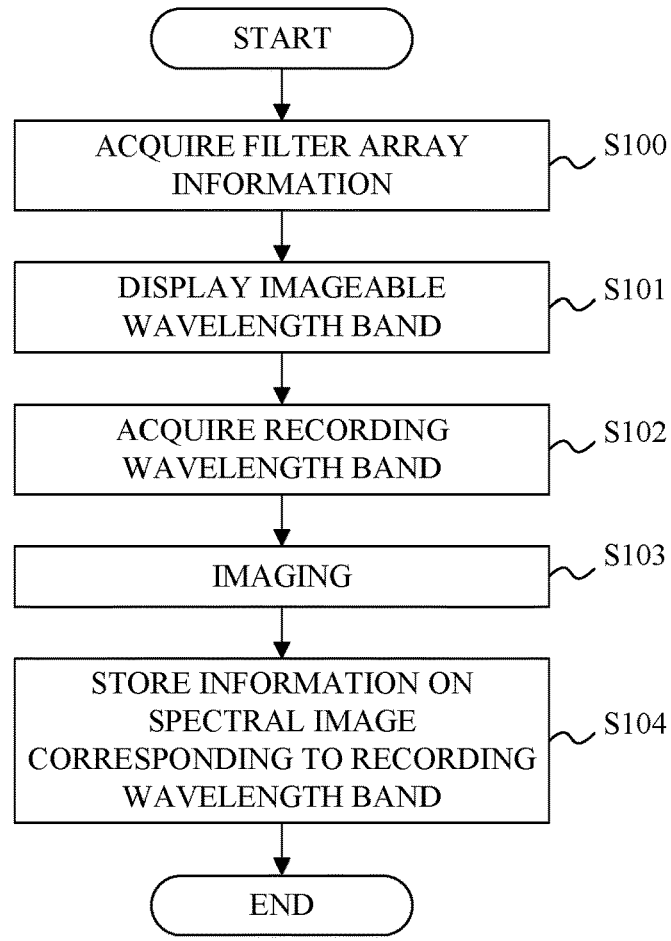
FIG. 3 is a flowchart showing an imaging operation according to the first embodiment.

FIG. 3 is a flowchart showing an imaging operation according to this embodiment executed by the system controller 90. In FIG. 3, "S" stands for the step. When the imaging signal is input by the user pressing a release button or the like, the system controller 90 starts the processing of this flow.

In the step S100, the system controller 90 acquires the filter array information from the filter information acquirer 80. In this embodiment, the filter array information includes information on the transmission characteristic of each filter.

Figure 4:
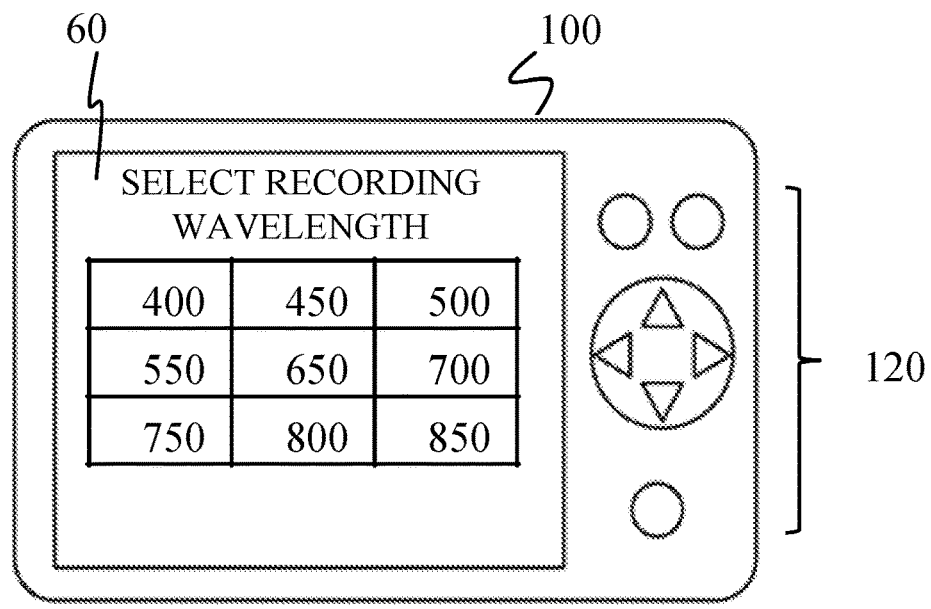
FIG. 4 illustrates a user selection screen displayed on a display unit in the first embodiment.

In the step S101, the system controller 90 displays the imagable wavelength band on the display unit 60 using the filter array information. FIG. 4 illustrates a user selection screen displayed on the display unit 60. This embodiment displays the imagable wavelength band (400 to 850 nm) corresponding to the filters 4A11 to 4A33 in the filter array 4.

In the step S102, the system controller 90 acquires from the wavelength selector 40 the wavelength band (recording wavelength band) that the user wants to record. The image pickup system 100 can acquire spectral images of nine kinds of wavelength bands in single imaging, but if all the spectral images are recorded, a data amount becomes so large that the memory capacity may become insufficient. In addition, for the user, the wavelength band for the evaluation or analysis is fixed, and the spectral image data in unused wavelength bands is useless. For example, in one embodiment, when only NDVI is to be evaluated, which is an index showing the distribution status and activity of vegetation used in the agricultural field, only spectral image data in two wavelength bands near 650 nm and 800 nm is required. That is, when the user wants to evaluate only NDVI, only the spectral image data in the two wavelength bands of 650 nm and 800 nm may be recorded. In this embodiment, when the user selects the two wavelength bands of 650 nm and 800 nm using the input button 120, the wavelength selector 40 selects the two wavelength bands of 650 nm and 800 nm as the recording wavelength band. Since the system controller 90 stores information on the spectral image only in the recording wavelength band as described later, the data amount to be stored can be significantly reduced.

In the step S103, the system controller 90 controls the imaging control unit 50 to execute imaging.

In the step S104, the system controller 90 causes the recording controller 70 to store in the memory 110, the information on the spectral images corresponding to the recording wavelength band. This embodiment records the information on the spectral images only of 650 nm and 800 nm selected as the recording wavelength band, and significantly reduces the data amount to be stored.

As described above, the configuration according to this embodiment can reduce the data amount to be stored because this embodiment stores information on the spectral image only in the wavelength band selected according to the purpose of use.

Second Embodiment

This embodiment differs from the first embodiment in the items selected by the user. Since other configurations are the same as those of the first embodiment, a detailed description thereof will be omitted.

Figure 5:
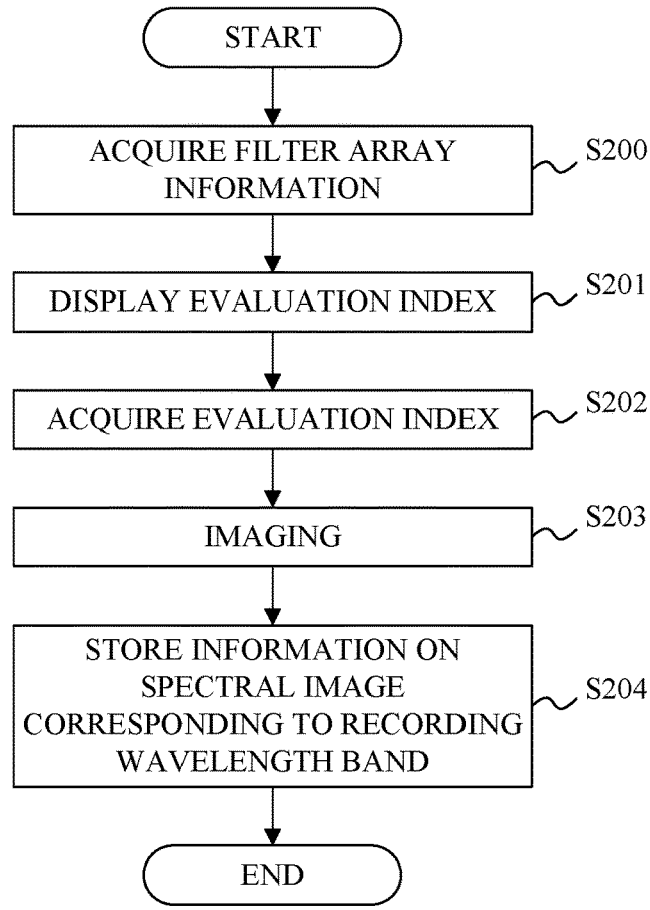
FIG. 5 is a flowchart showing an imaging operation according to a second embodiment.

FIG. 5 is a flowchart showing an imaging operation according to this embodiment executed by the system controller 90. In FIG. 5, "S" stands for the step. When the imaging signal is input by the user pressing the release button or the like, the system controller 90 starts the processing of this flow.

In the step S200, the system controller 90 acquires filter array information from the filter information acquirer 80. In this embodiment, the filter array information is information on the transmission characteristic of each filter.

Figure 6:
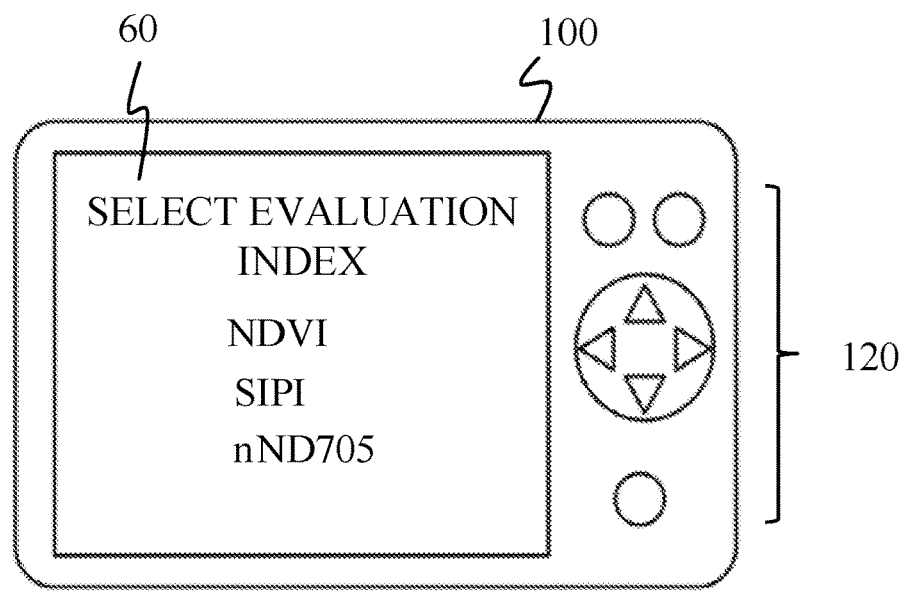
FIG. 6 illustrates a user selection screen displayed on a display unit in the second embodiment.

In the step S201, the system controller 90 displays, on the display unit 60 based on the filter array information, an evaluation index that can be evaluated in a spectroscopic analysis. FIG. 6 illustrates a user selection screen displayed on the display unit 60. This embodiment displays the evaluation index (NDVI, SIPI, nND705) that can be evaluated with the transmission characteristic of the filter array 4, on the display unit 60 as an example of the evaluation index that can be evaluated in the spectroscopic analysis. SIPI is an index used to evaluate carotene, and mainly uses three wavelength bands of 445, 680, and 800 nm. nND705 is an index used to evaluate an amount of chlorophyll in plants, and mainly uses three wavelength bands of 445, 700, and 750 nm.

In the step S202, the system controller 90 acquires from the wavelength selector 40, the wavelength band (recording wavelength band) required for the evaluation index that the user wants to acquire. The image pickup system 100 can acquire spectral images of nine kinds of wavelength bands in single imaging, but if all the spectral images are recorded, a data amount of data becomes so large that the memory capacity may be insufficient. In addition, for the user, the wavelength band for the evaluation or analysis is fixed, and the spectral image data in unused wavelength bands is useless. In this embodiment, for example, when the user selects the SIPI evaluation index using the input button 120, the wavelength selector 40 selects three wavelength bands of 445, 680, and 800 nm as the recording wavelength band. Since the system controller 90 stores information on the spectral image in the recording wavelength band as described later, the data amount to be stored can be significantly reduced.

In the step S203, the system controller 90 controls the imaging control unit 50 and execute imaging.

In the step S204, the system controller 90 causes the recording controller 70 to store in the memory 110, the information on the spectral image corresponding to the recording wavelength band. This embodiment records only the information on the spectral image of 445, 680, and 800 nm selected as the recording wavelength band, and significantly reduces the data amount to be stored.

As described above, the configuration according to this embodiment can reduce the data amount to be stored because it stores information on the spectral image only in the wavelength band selected according to the purpose of use.

OTHER EMBODIMENTS

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-119816, filed on Jul. 13, 2020 which is hereby incorporated by reference herein in its entirety.

What is claimed is:

1. An apparatus configured to acquire a plurality of spectral images of an object, the apparatus comprising at least one processor,
wherein the at least one processor executes a control task configured to store in a memory information on a spectral image, among the plurality of spectral images, corresponding to a recording wavelength band according to an input by a user,
wherein the apparatus acquires the plurality of spectral images by imaging the object through a plurality of lens units with different optical axes each configured to form an image of the object, and a plurality of filters each of which is disposed on a corresponding one of the optical axes.

2. The apparatus according to claim 1, wherein the plurality of filters include a first filter and a second filter which have transmission characteristics different from each other.

3. The apparatus according to claim 1, wherein the plurality of filters are attachable to and detachable from the apparatus.

4. The apparatus according to claim 1, wherein the at least one processor executes an acquisition task configured to acquire information on transmission characteristics of the plurality of filters, and
wherein the input relates to the information on the transmission characteristics of the plurality of filters.

5. The apparatus according to claim 1, wherein the at least one processor executes a display task configured to display a plurality of wavelength bands based on information on transmission characteristics of the plurality of filters,
wherein the input is based on the displayed plurality of wavelength bands.

6. The apparatus according to claim 1, wherein the at least one processor executes a display task configured to display an evaluation index used for a spectroscopic analysis based on information on transmission characteristics of the plurality of filters,
wherein the input is based on the displayed evaluation index.

7. The apparatus according to claim 1, wherein the input is executed using at least one of an input button, a touch panel, and an eye tracker.

8. A system comprising:
a plurality of lens units with different optical axes each configured to form an image of an object;
a plurality of filters each of which is disposed on a corresponding one of the optical axes; and
an apparatus configured to acquire a plurality of spectral images of the object by imaging the object through the plurality of lens units and the plurality of filters,
wherein the apparatus includes at least one processor,
wherein the at least one processor executes a control task configured to store in a memory information on a spectral image, among the plurality of spectral images, corresponding to a recording wavelength band according to an input by a user.

9. The system according to claim 8, wherein the plurality of filters include a first filter and a second filter which have transmission characteristics different from each other.

10. The system according to claim 8, wherein the plurality of filters are attachable to and detachable from the image pickup apparatus.

11. The system according to claim 8, wherein the at least one processor executes an acquisition task configured to acquire information on transmission characteristics of the plurality of filters, and wherein the input relates to the information on the transmission characteristics of the plurality of filters.

12. The system according to claim 8, wherein the at least one processor executes a display task configured to display a plurality of wavelength bands based on information on transmission characteristics of the plurality of filters, wherein the input is based on the displayed plurality of wavelength bands.

13. The system according to claim 8, wherein the at least one processor executes a display task configured to display an evaluation index used for a spectroscopic analysis based on information on transmission characteristics of the plurality of filters, wherein the input is based on the displayed the evaluation index.

14. The system according to claim 8, wherein the input is executed using at least one of an input button, a touch panel, and an eye tracker.

* * * * *